(12) United States Patent
Monney

(10) Patent No.: US 8,653,741 B2
(45) Date of Patent: Feb. 18, 2014

(54) MULTIPLE CAPACITIVE (BUTTON) SENSOR WITH REDUCED PINOUT

(75) Inventor: Pascal Monney, San Diego, CA (US)

(73) Assignee: Semtech Corporation, Camarillo, CA (US)

(*) Notice: Subject to any disclaimer, the term of this patent is extended or adjusted under 35 U.S.C. 154(b) by 205 days.

(21) Appl. No.: 13/353,171

(22) Filed: Jan. 18, 2012

(65) Prior Publication Data

US 2012/0181943 A1    Jul. 19, 2012

Related U.S. Application Data

(60) Provisional application No. 61/434,321, filed on Jan. 19, 2011.

(51) Int. Cl.
*H05B 37/02* (2006.01)
*G06F 3/041* (2006.01)

(52) U.S. Cl.
USPC ............ 315/210; 315/291; 315/313; 345/173

(58) Field of Classification Search
USPC ............ 315/210, 209 R, 217, 291, 294, 297, 315/307, 308, 313, 317–319, 320; 345/173, 345/174, 179
See application file for complete search history.

(56) References Cited

U.S. PATENT DOCUMENTS

| 6,987,787 | B1 | 1/2006 | Mick |
| 7,098,414 | B2 | 8/2006 | Caldwell |
| 8,173,920 | B2* | 5/2012 | Altonen et al. ............... 200/310 |
| 2008/0110739 | A1 | 5/2008 | Peng et al. |
| 2009/0174686 | A1 | 7/2009 | Jeon et al. |
| 2009/0302778 | A1 | 12/2009 | Wang |
| 2010/0073079 | A1 | 3/2010 | Ullen et al. |
| 2010/0177058 | A1 | 7/2010 | Lin |
| 2010/0187023 | A1 | 7/2010 | Min |
| 2012/0001862 | A1* | 1/2012 | Durbin et al. ................. 345/174 |
| 2012/0169636 | A1* | 7/2012 | Liu ............................... 345/173 |

OTHER PUBLICATIONS

Using Light Emitting Diode Arrays as Touch-Sensitive Input and Output Devices, Scott E. Hudson; Human-Computer Interaction Institute Carnegie Mellon University, Pittsburgh, PA, vol. 6, Issue 2, pp. 287-290.

* cited by examiner

*Primary Examiner* — James H Cho
(74) *Attorney, Agent, or Firm* — O'Melveny & Myers LLP

(57) ABSTRACT

A capacitive touch sensor and LED driver device achieves a reduction in pin count by multiplexing LED drive functionality and capacitive sense functionality on each input/output pin. A control circuit switches between LED drive mode and capacitive sense mode at a frequency of approximately 200 Hz, although other switching frequencies can be used. A bias driver functions as a current sink for LEDs in LED drive mode and can also be used to drive a bias voltage to the LEDs during capacitive sense mode to improve noise immunity.

17 Claims, 5 Drawing Sheets

MULTIPLE CAPACITIVE (BUTTON) SENSOR WITH REDUCED PINOUT

RELATED APPLICATION DATA

This application claims priority pursuant to 35 U.S.C. §119(e) to U.S. provisional patent application Ser. No. 61/434,321 filed Jan. 19, 2011, the subject matter of which is incorporated by reference herein in its entirety.

BACKGROUND OF THE INVENTION

1. Field of the Invention

The present invention relates to multiple-capacitive-sensor controllers, and more particularly, to multiple-capacitive-sensor controllers containing general purpose input-output ports that can be shared by an LED driver and a capacitive touch detector.

2. Description of Related Art

Multiple-capacitive-sensor controllers are well known in the art and are an integral part of a sensor that uses the properties of capacitors to detect physical distance from the user or touches by the user. In addition to being a pure sense device, most multiple-capacitive-sensor controllers also contain input-output ports that can be used to control Light Emitting Diodes (LED).

Touch sensors such as capacitive buttons are often used in devices to allow the user to control the devices by approaching or touching them. LED drivers are often used to facilitate a response to the proximity of the user or touches by the user. Therefore, it would reduce the number of components and system cost if the multiple-capacitive-sensor controllers could also be used to control the LEDs.

FIG. 1 depicts a simplified circuit diagram of a system containing a multiple-capacitive-sensor controller 101 that is typical of the prior art. The multiple-capacitive-sensor controller 101 contains multiple I/O ports. Each I/O port can be configured as either a capacitive sensor pin or an LED driver. A capacitive sensor pin 102, after configuration, will have a capacitive sensor 104 connected to a pad 106. Pad 106 is then connected to a capacitive element 108. When a user interacts with capacitive element 108 through physical means such as approaching or touching it, the capacitive value of capacitive element 108 will change. Capacitive sensor 104 detects the capacitance change, allowing the system to react to the user interaction accordingly. An LED driver pin 110, after configuration, will have an LED Driver 112 connected to pad 116, which is connected to LED 114. This allows the system to use the capacitive sensor controller to control the LEDs.

However, the single sensor controller solution still requires one I/O port per function. Thus, it is not the most efficient solution in terms of system area and cost. For example, the prior art multiple capacitive sensor controller will need to have 10 I/Os if the system needs 5 capacitive inputs and 5 LED drivers. Accordingly, being able to use a single I/O for both capacitive input and LED driver functionalities reduces the I/O port requirement of the sensor controller. Using the present invention, a multiple capacitive sensor controller that needs to handle 5 capacitive inputs and 5 LED drivers will only need 6 I/O ports: 5 I/O ports to handle the capacitive inputs and LED drivers and 1 bias driver port.

SUMMARY OF THE INVENTION

An embodiment of an electronic touch sensor device in accordance with the present invention comprises a control circuit, at least one light emitting diode (LED) having a first electrode and a second electrode, and at least one input/output circuit operatively connected to the control circuit. The input/output circuit includes a capacitive sense circuit that is configured to measure a change in capacitance when an object approaches the touch sensor device. The input/output circuit also includes an LED driver circuit configured to drive the first electrode of the LED. The control circuit is configured to selectively disable and enable the capacitive sense circuit and the LED drive circuit such that when the capacitive sense circuit is disabled, the LED drive circuit is enabled, and vice versa. The embodiment of the electronic touch sensor device further includes a bias driver circuit configured to drive the second electrode of the LED.

In some embodiments of an electronic touch sensor device in accordance with the present invention, there are N input/output circuits configured to drive N LEDs, where N is an integer greater than one. In such an embodiment, the bias driver circuit is configured to drive the second electrode of all N LEDs.

In some embodiments, the control circuit may comprise an application specific integrated circuit (ASIC). In other embodiments, the control circuit may comprise a field-programmable gate array (FPGA), any other type of logic circuit, or a microprocessor or similar device.

In some embodiments of a touch sensor in accordance with the present invention, the control circuit is configured to switch between the LED drive mode and the capacitive sense mode on a periodic basis. In some embodiments, the switching frequency is set to be approximately 200 Hz. However, other switching frequencies are possible and would similarly fall within the scope and spirit of the present invention.

In some embodiments of a touch sensor in accordance with the present invention, the control signal is configured to drive a pulse-width-modulated (PWM) signal to each LED driver circuit such that the brightness of each LED driven by each LED driver circuit can be controlled by adjusting the duty cycle of the PWM waveform.

In some embodiments of a touch sensor in accordance with the present invention, the bias driver circuit is configured such that when the LED drivers are disabled and the capacitive sensors are enabled, the bias driver applies a voltage to the second electrode of each LED that substantially matches the voltage at the first electrode of each LED. This reduces the susceptibility of the capacitive sense circuit to noise.

While particular embodiments of an electronic touch sensor device have been described, one of ordinary skill in the art studying the present specification and description of the invention will become aware of other variations and applications of the invention that will also fall within the scope and spirit of the present invention. The invention is described in detail below with reference to the appended sheets of drawings which are first described briefly below.

DETAILED DESCRIPTION OF THE PREFERRED EMBODIMENT

Figure 1:
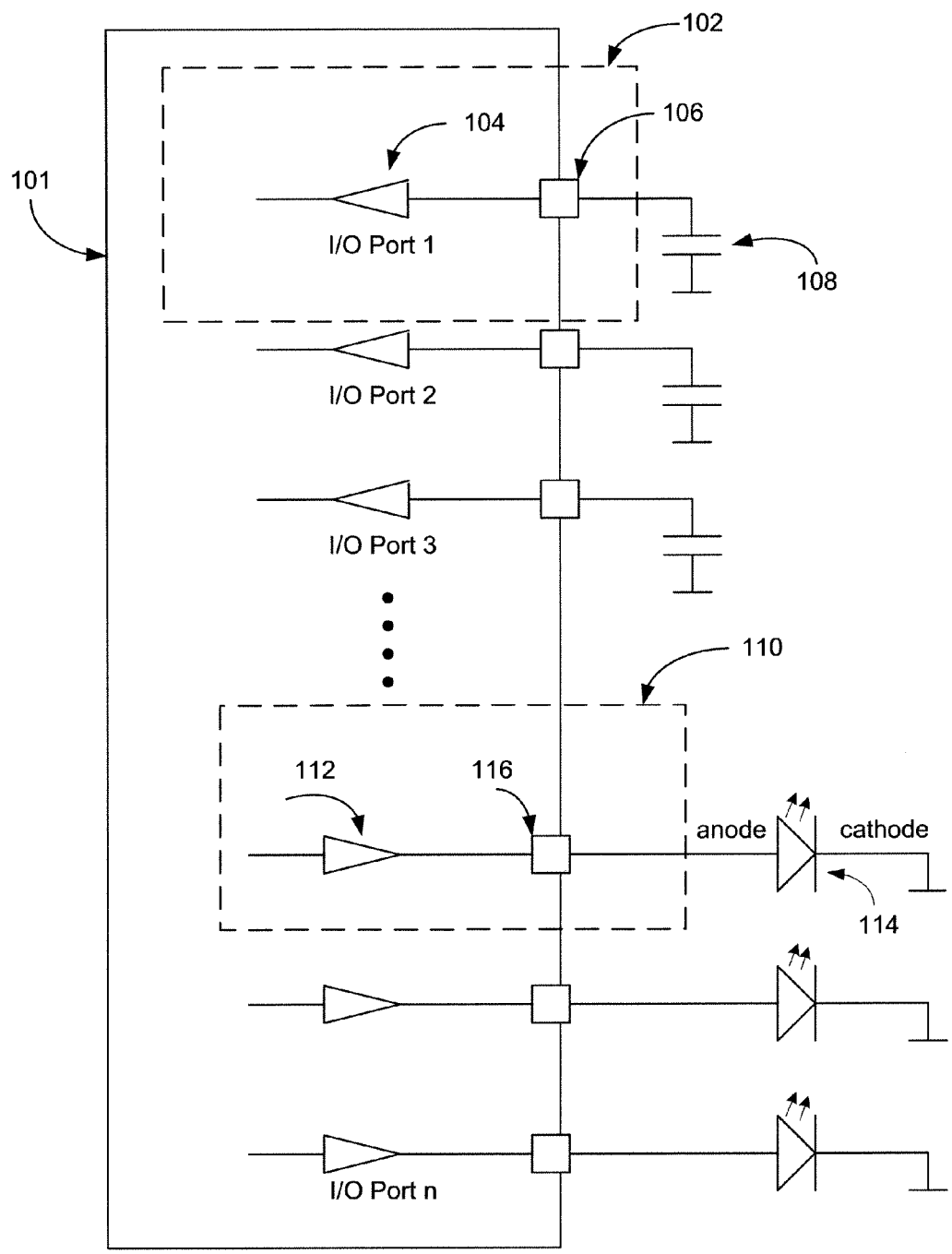
FIG. 1 depicts a simplified circuit diagram of a system containing a multiple-capacitive-sensor controller typical of the prior art.
Figure 2:
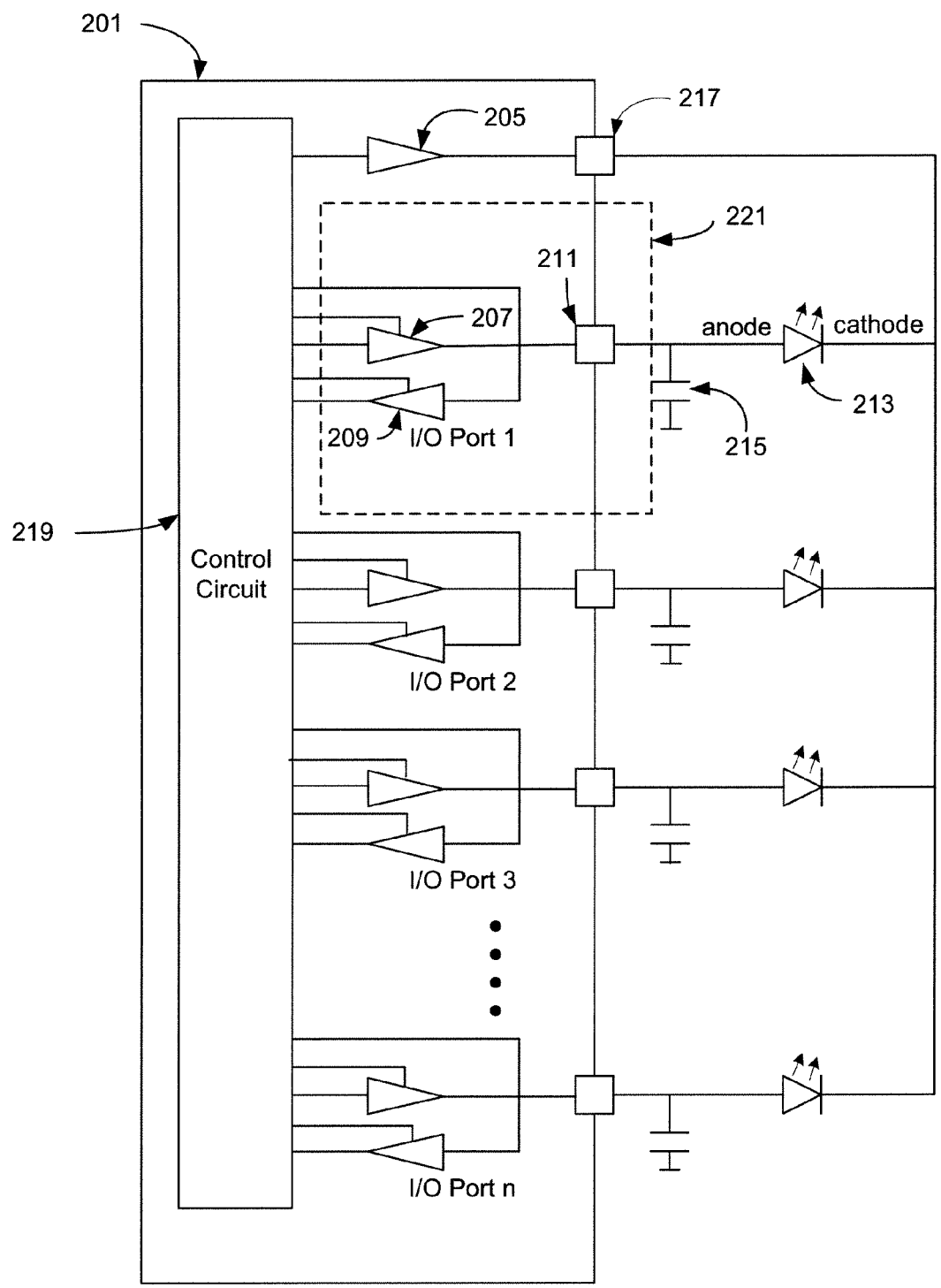
FIG. 2 depicts a circuit diagram of a system containing a multiple-capacitive-sensor controller in accordance with an exemplary embodiment of the present invention.

An embodiment of the present invention includes an apparatus and method of using a single I/O port as a capacitive input and LED driver. FIG. 2 depicts a simplified circuit diagram of a multiple-touch-sensor controller 201 in accordance with an embodiment of the present invention. The multiple-touch-sensor controller 201 contains a bias driver 205, a control circuit 219 and n number of I/O ports 221. Each I/O port 221 contains both an LED driver 207 and a capacitive sensor 209. The output of LED driver 207 is connected to the input of capacitive sensor 209 and pad 211. Pad 211 is further connected to control circuit 219, capacitive element 215 and the anode of LED 213. The cathode of LED 213 is then connected to bias driver 205 through pad 217. Control circuit 219 controls the LED drivers, capacitive sensors and bias driver based on the functionality needed, as described below.

Figure 3:
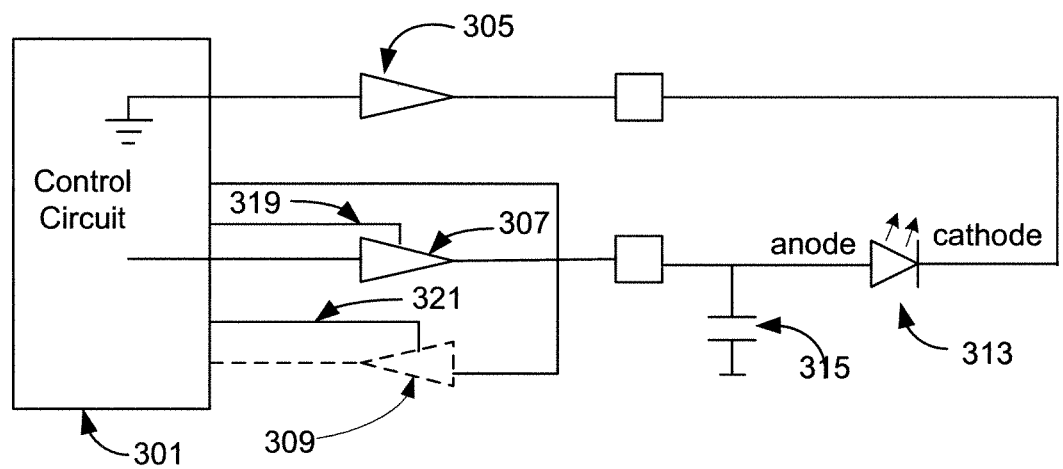
FIG. 3 depicts a simplified representation of an I/O port during LED drive operation in accordance with an exemplary embodiment of the present invention.

FIG. 3 depicts a simplified representation of an I/O port during LED drive operation in accordance with an embodiment of the present invention. In this operation, control circuit 301 disables capacitive sensor 309 by driving capacitive sensor enable signal 321 to a logical low while simultaneously enabling LED driver 307 by driving LED driver enable signal 319 to a logical high. The LED driver enable signal 319 can also be controlled by a low-high pulse-width modulation (PWM), which is well known in the art, to control the LED intensity. The bias driver 305 is tied to a fixed voltage, such as ground, to allow for current flow through LED 313.

Figure 4:
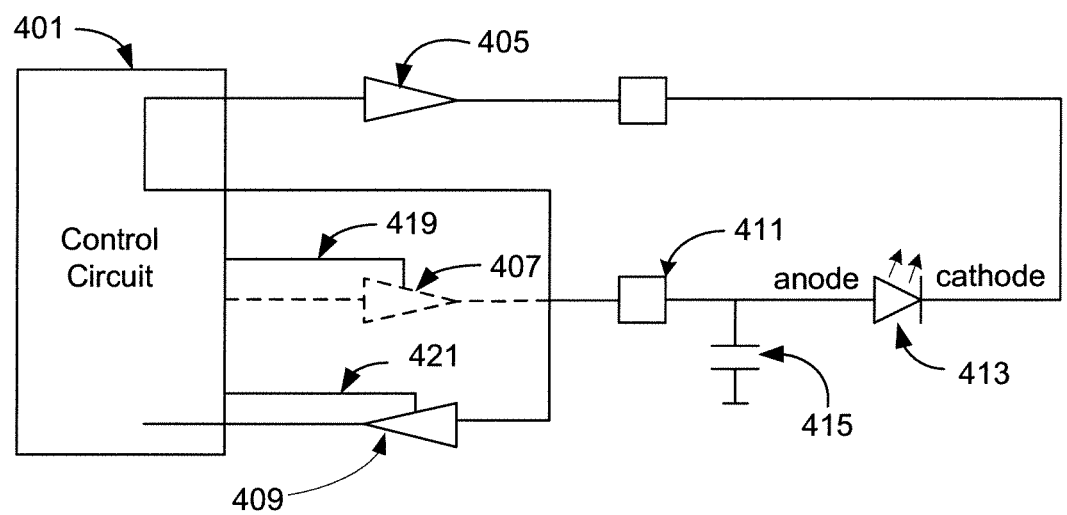
FIG. 4 depicts a simplified representation of an I/O port during capacitive sensing operation.

FIG. 4 depicts a simplified representation of an I/O port during a capacitive sensing operation. In this operation, control circuit 401 enables capacitive sensor 409 by driving capacitive sensor enable signal 421 to a logical high while simultaneously disabling LED driver 407 by driving LED driver enable signal 419 to a logical low. When a user interacts with capacitive element 415, the capacitance value of capacitive element 415 will change, resulting in a change in voltage level on pad 411. Capacitive sensor 409 detects the voltage level on pad 411, allowing the system to react to the user interaction. The control circuit also feeds the voltage level to bias driver 405. This allows bias driver 405 to track the voltage on pad 411 and drives the same voltage to the cathode of LED 413, resulting in a constant, near zero voltage across LED 413.

Figure 5:
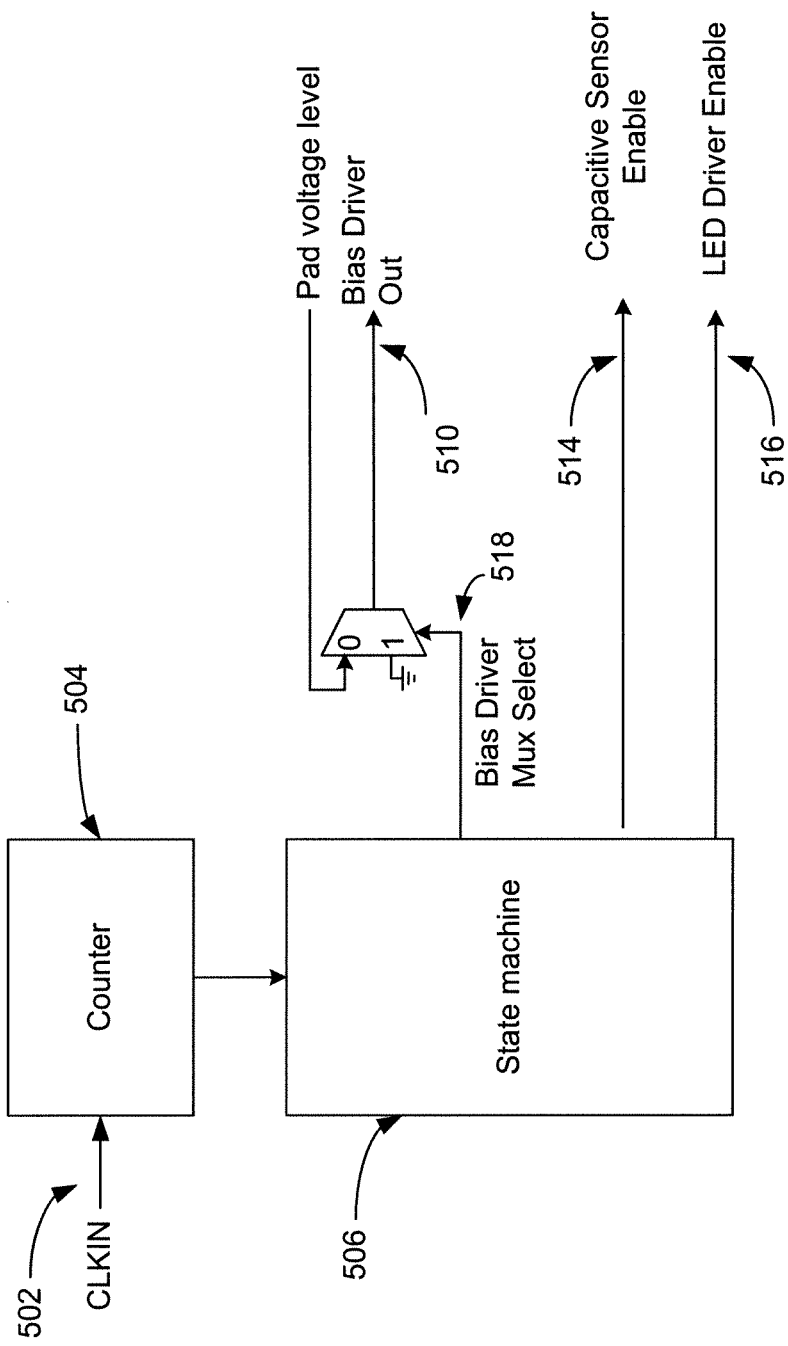
FIG. 5 depicts a simple circuit diagram of a control circuit in accordance with an exemplary embodiment of the present invention.

In comparison with prior art capacitive sensor controllers, the current invention allows an LED and a capacitive element to share an I/O port because the control circuit can control when to enable or disable the capacitive sensing and LED drive operations. Such a control circuit can be implemented using an Application Specific Integrated Circuit (ASIC), programmable logic such as a Field Programmable Gate Array (FPGA), a microprocessor, or similar device known in the art. FIG. 5 depicts one embodiment of a multiple-capacitive-sensor controller in accordance with the present invention, wherein a time-multiplexed control circuit enables capacitive sensing for a period of time to detect possible inputs, after which it disables capacitive sensing and enables LED drive operation. In this embodiment, counter 504 uses a fixed frequency clock signal 502 to determine time. State machine 506 uses the timing signal generated by counter 504 to determine whether the I/O ports should be in capacitive sensing or LED drive operation. State machine 506 controls bias driver mux select signal 518, bias driver out signal 510, capacitive sensor enable signal 514 and LED driver enable signal 516 accordingly. It should be recognized by one of ordinary skill in the art that the state machine described above is only one possible implementation of the invention. Other implementations, including software controllers, digital controllers, or analog controllers are also possible and would similarly fall within the scope and spirit of the present invention.

Figure 6:
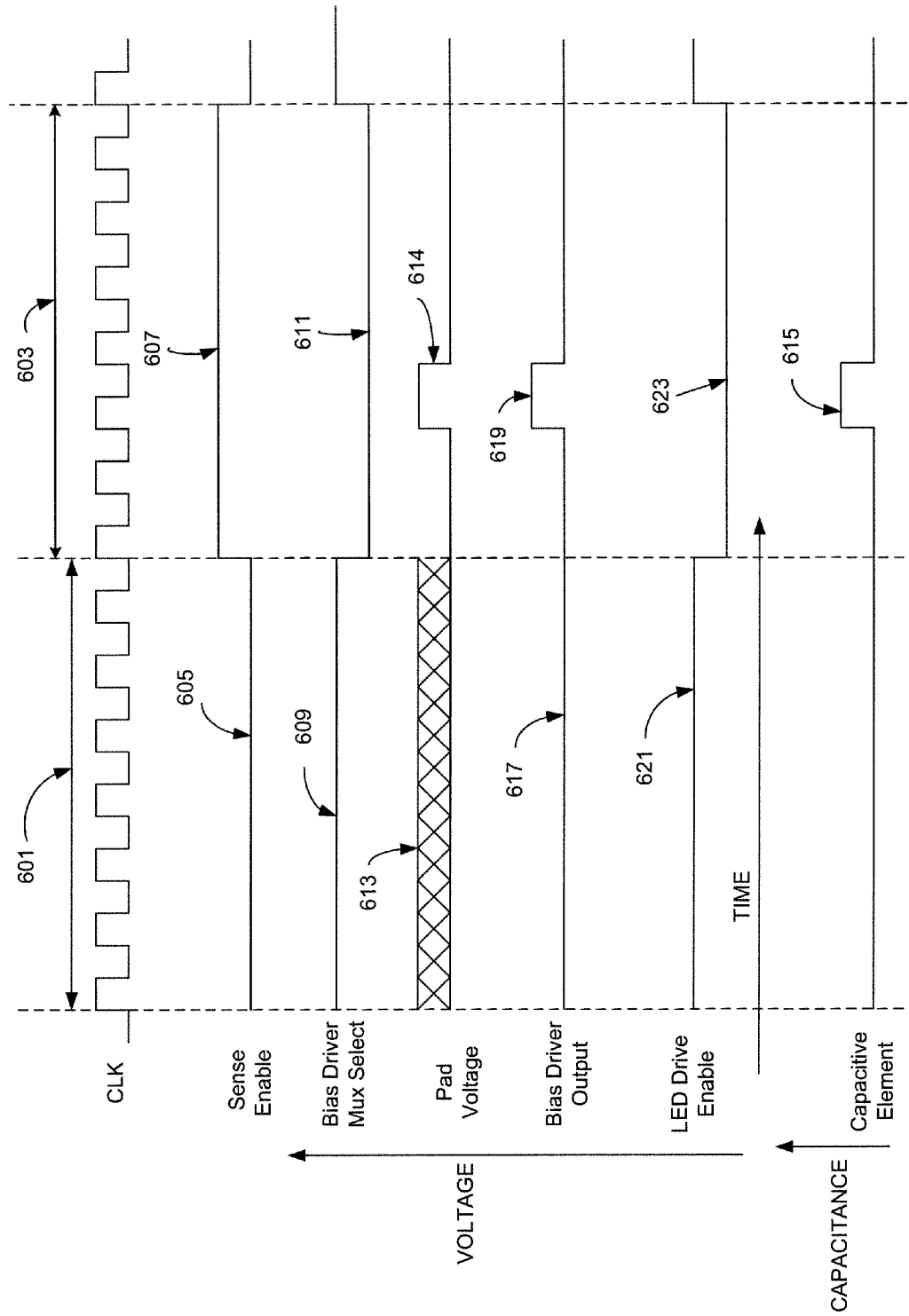
FIG. 6 depicts a voltage waveform and timing diagram associated with an embodiment of a multiple-capacitive-sensor controller in accordance with the present invention.

In accordance with one embodiment of the present invention, FIG. 6 depicts an exemplary voltage level and timing diagram of the various signals during a complete timing cycle, spanning one capacitive sensing and LED drive operation. During LED drive operation 601, the capacitive sensor is disabled, as reflected by waveform 605. The LED driver is enabled, as reflected by waveform 621. During this time, the voltage level at pad 211 is controlled by the LED driver, as reflected by waveform 613. The bias driver mux is set to select ground, as reflected by waveform 609. This ties the output of the bias driver to ground, as reflected by waveform 617, allowing current to flow through the LED. During capacitive sensing operation 603, the capacitive sensor is enabled, as reflected by waveform 607. The LED driver is disabled, as reflected by waveform 623. When a user approaches or touches capacitive element 215, the capacitance of capacitive element 315 changes, as reflected by waveform 615. The voltage level on pad 211 also changes, as reflected by waveform 614. The bias driver mux is set to select the pad voltage level, as reflected by waveform 611. Therefore, the bias driver outputs the same voltage level that appeared at pad 211, as reflected by waveform 619, resulting in a constant, near zero voltage across LED 215. In a preferred embodiment of a multiple-capacitive-sensor controller in accordance with the present invention, a complete timing cycle, comprising capacitive sense mode and LED drive mode combined, has a duration of approximately 5 milliseconds (200 Hz). Of course, other operating frequencies are also possible and would fall within the scope and spirit of the present invention. At a frequency of 200 Hz or above, the capacitive read operation occurs with sufficient frequency to properly detect user inputs, and each capacitive read operation is short enough to ensure that the LED off time is unnoticeable to the user.

In addition to reducing system area and cost, the present invention also improves noise immunity and reduces system current consumption. With reference with FIG. 2, the LED 213 is electrically connected to capacitive sensor 209 and acts as an antenna. This allows other, adjacent pins and power supplies to inject electrical noise onto the capacitive sensor, creating false input detection. In an embodiment of the present invention, the bias driver ensures that the LED's anode and cathode are driven to the same voltage as the capacitive sensor input during the capacitive sense operation, eliminating noise injection from other, adjacent pins and power supplies through the LED. Nulling the voltage across the LED's anode and cathode also neutralizes the LED's parasitic parameters such as capacitance and leakage current, which, in turn, eliminates charge flow through the LED, increasing noise isolation from other pins.

Although a particular embodiment of a multiple touch sensor controller was discussed here, other embodiments and implementations are possible and would also fall within the scope and spirit of the present invention. Similarly, the control circuit discussed above with reference to FIG. 5 can be easily adapted by one of ordinary skill in the art to handle other scenarios, such as an event driven scenario. For example, in an alternative embodiment, the system has a standby mode during which the LED is turned off. Accordingly, the control circuit is designed such that when in standby mode, the capacitive sensors are enabled and the LED drivers are disabled. The control circuit will continuously monitor the capacitive sensors and only enables the LED drivers when a user input is detected.

The invention is further defined by the following claims.

What is claimed is:

1. An electronic touch sensor device comprising:
   a control circuit;
   at least one light emitting diode (LED) having a first electrode and a second electrode;
   at least one input/output circuit operatively connected to the control circuit and comprising:
      a capacitive sense circuit configured to detect a change in capacitance when an object approaches the touch sensor device, wherein the capacitive sense circuit is selectively disabled and enabled by the control circuit;
      an LED driver circuit configured to drive the first electrode of the at least one LED, wherein the LED driver circuit is selectively enabled and disabled by the control circuit;
      wherein the LED driver circuit is disabled when the capacitive sense circuit is enabled, and wherein the LED driver circuit is enabled when the capacitive sense circuit is disabled; and
   a bias driver circuit configured to drive the second electrode of the at least one LED.

2. The electronic touch sensor device of claim 1, further comprising:
   N LEDs, where N is an integer greater than one;
   N input/output circuits operatively connected to the control circuit;
      wherein the LED driver circuit of each of the N input/output circuits is configured to drive the first electrode of each of the N LEDs, respectively; and
      wherein the bias driver circuit is configured to drive the second electrode of all of the N LEDs.

3. The electronic touch sensor device of claim 1, wherein the control circuit comprises at least one of an Application Specific Integrated Circuit (ASIC), a Field Programmable Gate Array (FPGA), a logic circuit, and a microprocessor.

4. The electronic touch sensor device of claim 1, wherein the control circuit is configured to send a pulse-width-modulated signal to the at least one LED driver circuit in order to control a brightness of the at least one LED.

5. The electronic touch sensor device of claim 1, wherein the control circuit is further configured to disable the at least one LED driver circuit and to enable the at least one capacitive sense circuit and then to enable the at least one LED driver circuit and to disable the at least one capacitive sense circuit on a periodic basis.

6. The electronic touch sensor device of claim 5, wherein the periodic basis comprises a cycle frequency of approximately 200 Hz.

7. The electronic touch sensor device of claim 1, wherein the bias driver circuit is configured to drive the second electrode of the at least one LED to a voltage substantially equal to a voltage at the capacitive sense circuit when the LED driver circuit is disabled and the capacitive sense circuit is enabled, such that the capacitive sense circuit is substantially immune to noise.

8. An electronic touch sensor device comprising:
   a control circuit;
   N light emitting diodes (LEDs),
      wherein N is an integer greater than one; and
      wherein each of the N LEDs has a first electrode and a second electrode;
   N input/output circuits, each operatively connected to the control circuit and each comprising:
      a capacitive sense circuit configured to detect a change in capacitance when an object approaches the touch sensor device, wherein the capacitive sense circuit is selectively disabled and enabled by the control circuit;
      an LED driver circuit configured to drive the first electrode of one of the N LEDs, wherein the LED driver circuit is selectively enabled and disabled by the control circuit, wherein:
         an output of the LED driver circuit, an input of the capacitive sense circuit, and the first electrode of one of the N LEDs all connect to a common node; and
         the LED driver circuit is disabled when the capacitive sense circuit is enabled, and the LED driver circuit is enabled when the capacitive sense circuit is disabled; and
   a bias driver circuit configured to drive the second electrode of each of the N LEDs.

9. The electronic touch sensor device of claim 8, wherein the control circuit comprises at least one of an Application Specific Integrated Circuit (ASIC), a Field Programmable Gate Array (FPGA), a logic circuit, and a microprocessor.

10. The electronic touch sensor device of claim 8, wherein the control circuit is configured to send a pulse-width-modulated signal to the N LED driver circuits in order to control a brightness of the N LEDs.

11. The electronic touch sensor device of claim 8, wherein the control circuit is further configured to disable the N LED driver circuits and to enable the N capacitive sense circuits and then to enable the N LED driver circuits and to disable the N capacitive sense circuit on a periodic basis.

12. The electronic touch sensor device of claim 11, wherein the periodic basis comprises a cycle frequency of approximately 200 Hz.

13. The electronic touch sensor device of claim 8, wherein the bias driver circuit is configured to drive the second electrode of the N LEDs to a voltage substantially equal to a voltage at the N capacitive sense circuits when the N LED driver circuits are disabled and the N capacitive sense circuits are enabled, such that the N capacitive sense circuits are substantially immune to noise.

14. In an electronic touch sensor device comprising a control circuit; N input/output circuits each comprising an LED driver circuit and a capacitive sense circuit; and a bias driver circuit; a method of multiplexing capacitive sensing functionality and LED driving functionality comprises the steps of:
   during a drive-off portion of an operational cycle:
      disabling the LED driver circuit of each of the N input/output circuits; and
      enabling the capacitive sense circuit of each of the N input/output circuits; and
   during a drive-on portion of the operational cycle:
      enabling the LED driver circuit of each of the N input/output circuits; and
      disabling the capacitive sense circuit of each of the N input/output circuits.

15. The method of multiplexing capacitive sensing functionality and LED driving functionality of claim 14, further comprising:
   driving a pulse-width-modulated (PWM) signal from the control circuit to the LED driver circuit of each of the N input/output circuits in order to control a brightness of LEDs coupled to the N input/output circuits.

16. The method of multiplexing capacitive sensing functionality and LED driving functionality of claim 14 wherein the operational cycle repeats at a frequency of approximately 200 Hz.

17. The method of multiplexing capacitive sensing functionality and LED driving functionality of claim 14, further comprising the steps of:

during the drive-off portion of an operational cycle:
driving a signal from the bias driver circuit to LEDs coupled to the N input/output circuits such that the LEDs are subjected to a voltage bias that is substantially equal to zero in order to reduce susceptibility to noise of the capacitive sense circuits of each of the N input/output circuits.

* * * * *